(12) United States Patent
Nguyen et al.

(10) Patent No.: US 8,593,870 B2
(45) Date of Patent: Nov. 26, 2013

(54) INCREASED NAND FLASH MEMORY READ THROUGHPUT

(75) Inventors: Dzung H. Nguyen, Fremont, CA (US); Frankie F. Roohparvar, Monte Sereno, CA (US)

(73) Assignee: Round Rock Research, LLC, Jersey City, NJ (US)

( * ) Notice: Subject to any disclaimer, the term of this patent is extended or adjusted under 35 U.S.C. 154(b) by 0 days.

(21) Appl. No.: 13/465,577

(22) Filed: May 7, 2012

(65) Prior Publication Data
US 2012/0221780 A1    Aug. 30, 2012

Related U.S. Application Data

(63) Continuation of application No. 13/042,071, filed on Mar. 7, 2011, now Pat. No. 8,174,892, which is a continuation of application No. 12/425,200, filed on Apr. 16, 2009, now Pat. No. 7,903,463, which is a continuation of application No. 11/657,950, filed on Jan. 25, 2007, now Pat. No. 7,525,842.

(51) Int. Cl.
*G11C 16/06* (2006.01)
*G11C 16/04* (2006.01)

(52) U.S. Cl.
CPC ................................ *G11C 16/0483* (2013.01)
USPC ............ 365/185.17; 365/185.12; 365/185.33; 365/189.02; 365/230.02; 365/235

(58) Field of Classification Search
USPC ............ 365/185.17, 185.12, 185.33, 189.02, 365/230.02, 235
See application file for complete search history.

(56) References Cited

U.S. PATENT DOCUMENTS

| | | | |
|---|---|---|---|
| 5,559,952 A | 9/1996 | Fujimoto | |
| 5,787,445 A | 7/1998 | Daberko | |
| 5,956,743 A | 9/1999 | Bruce et al. | |
| 7,394,288 B1 | 7/2008 | Agarwal | |
| 7,525,842 B2 * | 4/2009 | Nguyen et al. | ........... 365/185.17 |
| 2005/0005069 A1 | 1/2005 | Au et al. | |
| 2005/0228962 A1 | 10/2005 | Takase et al. | |
| 2008/0181003 A1 | 7/2008 | Nguyen et al. | |

* cited by examiner

*Primary Examiner* — Thong Q Le
(74) *Attorney, Agent, or Firm* — Lerner, David, Littenberg, Krumholz & Mentlik, LLP

(57) ABSTRACT

A method of reading sequential pages of flash memory from alternating memory blocks comprises loading data from a first page into a first primary data cache and a second page into a second primary data cache simultaneously, the first and second pages loaded from different blocks of flash memory. Data from the first primary data cache is stored in a first secondary data cache, and data from the second primary data cache is stored in a second secondary data cache. Data is sequentially provided from the first and second secondary data caches by a multiplexer coupled to the first and second data caches.

8 Claims, 3 Drawing Sheets

INCREASED NAND FLASH MEMORY READ THROUGHPUT

CROSS-REFERENCE TO RELATED APPLICATIONS

The present application is a continuation of U.S. application Ser. No. 13/042,071 which was filed on Mar. 7, 2011, which is scheduled to issue as U.S. Pat. No. 8,174,892 on May 8, 2012, which is a continuation of U.S. application Ser. No. 12/425,200, which was filed on Apr. 16, 2009, which issued as U.S. Pat. No. 7,903,463 on Mar. 8, 2011, which is a continuation of U.S. application Ser. No. 11/657,950 which was filed on Jan. 25, 2007, which issued as U.S. Pat. No. 7,525,842 on Apr. 28, 2009, the disclosure of which is incorporated herein by reference.

BACKGROUND OF THE INVENTION

The invention relates generally to electronic memory, and more specifically to improving throuphput in reading flash memory.

A variety of computer systems and electronic devices use memory that is not volatile, or does not lose its content when power is disconnected. These nonvolatile memories can be reprogrammed, read, and erased electronically, and are particularly well suited to storing information such as music in digital audio players, pictures in digital cameras, and configuration data in cellular telephones. Such memory is commonly known as flash memory, named in part because a flash operation is used to erase the content of a block of data before it is reprogrammed, and is packaged for consumer use in products such as CompactFlash memory cards, USB flash memory drives, and other such devices.

Flash memory comprises a number of cells, each of which typically stores a single binary digit or bit of information. A typical flash memory or nonvolatile memory cell comprises a field effect transistor having an electrically isolated floating gate that controls electrical conduction between source and drain regions of the memory cell. Data is represented by a charge stored on the floating gate, and the resulting conductivity observed between the source and drain regions.

The floating gate separates a second gate from the source and drain regions of the memory cell, which is called the control gate. Electrons stored on the floating gate insulated from the control gate and the drain and source by an insulating oxide layer partially cancel out or modify an electric field produced by the control gate, resulting in a change in the effective threshold voltage ($V_t$) of the memory cell. When the memory cell is read by placing a specified voltage on the control gate, the electrical impedance between the source and drain of the device will either allow or not allow current to flow, depending on the presence of a charge on the floating gate and the effective $V_t$ or threshold voltage of the memory cell. The presence or absence of current above a threshold level is sensed, and used to determine the state of the memory cell, resulting in a one or zero value being read.

Memory cells are typically arranged in a two-dimensional array of rows and columns, where the rows are coupled via a wordline conductor and the columns are coupled via a bitline conductor. The wordline and bitline conductors are used during data read and write functions to either select certain wordlines for reading or to select words and bits for writing. Reads and writes are coordinated by memory controllers, which bring the flash memory cells into the proper state to be read or written, and which buffer the read or written value while it is being written or transferred out of memory.

The speed at which the write process works is limited in part by the memory control structure of the memory device, and in part by the amount of time needed to program a memory cell using the electron tunneling process. The read speed is limited largely by the time needed to load the read address into the memory controller, select and access a memory word, and load and buffer the read word so that it can be transferred out of the memory device into a processor, bus, or other electronic component. To provide faster availability of data to these other devices, to provide faster operation of electronic devices incorporating flash memory, and for other reasons, it is desired to transfer data from the flash memory quickly.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

Figure 1:
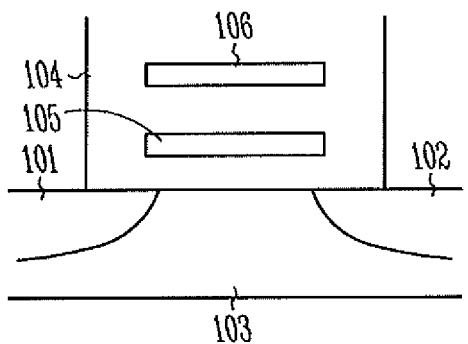
FIG. 1 is a cross-section view of a nonvolatile memory cell, as may be used to practice some embodiments of the invention.

FIG. 1 illustrates an example flash memory or nonvolatile memory cell, which shares a basic structure with an eeprom or electronically erasable programmable memory. A source 101 and drain 102 are formed on a substrate 103, where the substrate is made of a p-type semiconductor material. The source, drain, and substrate are in some embodiments formed of silicon, with a dopant having five valence electrons such as phosphorous, arsenic, or antimony to increase the electron concentration in the silicon or with a dopant having three valence electrons such as boron, gallium, indium, or aluminum to increase the hole concentration. Dopants are added in small, controlled quantities to produce the desired hole or electron concentration in the semiconductor material, resulting in n-type material if a surplus of electrons are present, such as in the source 101 and drain 102, and resulting on p-type material if an excess of holes are present such as in the substrate material 103.

An insulator material such as silicon oxide ($SiO_2$) is used to form an insulating layer 104, which has embedded within it a floating gate 105, fabricated from a conductor such as metal or polysilicon, and a control gate 106 similarly formed of a conductive material. The floating gate is not directly electrically coupled to another conductive element of the memory cell, but is "floating" in the insulating material 104. The floating gate is separated from the region of the p-type substrate material 103 between the source 101 and the drain 102 by a thin insulative layer of controlled thickness, such as one hundred angstroms.

In operation, the floating gate 105 is able to store a charge due to its electrical isolation from other components of the memory cell. Setting or erasing a charge level on the floating gate 105 is performed via a tunneling process known as Fowler-Nordheim tunneling, in which electrons tunnel through the oxide layer separating the floating gate 105 from the substrate 103. Most flash memory cells are categorized as NOR flash or NAND flash, based on the circuitry used to perform write, read, and erase operations.

To write a NAND flash memory cell, the source 101 and drain 102 of the memory cell of FIG. 1 are grounded, and the control gate 106 is brought to a higher voltage of perhaps 20 volts. This voltage is significantly higher than the 12 volt control gate voltage used to program the same memory cell using NOR flash methods, because a higher voltage is needed in the absence of "hot" electrons slowing between the source and drain of the memory cell.

To erase a NAND flash cell, the source 101 and drain 102 are left floating, but the substrate material 103 is brought to a high positive voltage such as 20 volts, attracting the negatively charged electrons and causing them to tunnel from the floating gate 105 through the oxide insulating layer 104 to the substrate material 103. This method is sometimes known as "channel erase", because the channel substrate material 103 receives electrons from the floating gate.

Figure 2:
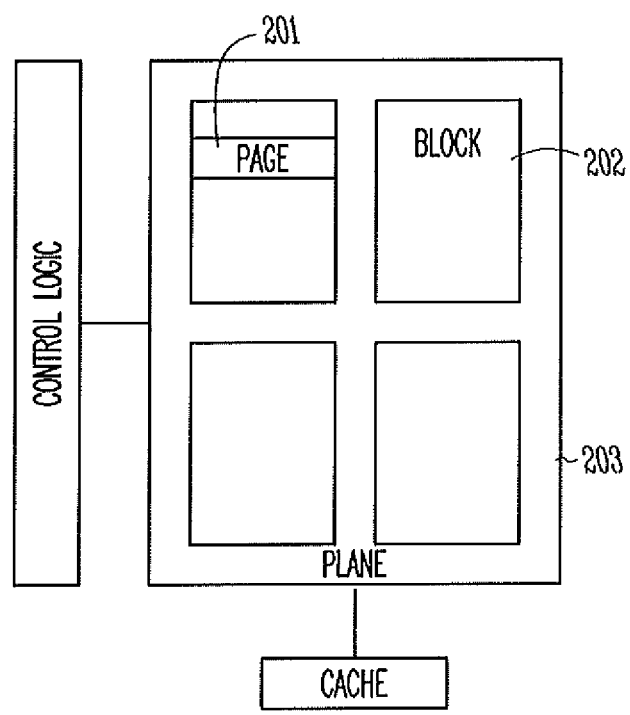
FIG. 2 is a block diagram of a typical flash memory, consistent with the prior art.

Memory cells such as that of FIG. 1 are typically arranged in arrays that are addressed via wordlines and bitlines coupled to a memory controller to form a memory device, as shown in FIG. 2. FIG. 2 is a block diagram of a NAND flash memory, consistent with the prior art.

In this example, a page 201 is a series of 2048 bytes of data that can be accessed by selecting the appropriate wordline for that page. The page comprises part of a block 202, while there are four blocks in the plane 203. In a typical modern NAND flash device, a block consists of many pages, such as 64, while a plane comprises a large number of blocks, such as 1024. In other embodiments, other structures of pages, blocks, and planes exist, including exclusion or addition of various levels of memory cell organization.

To perform a read operation, the wordline of the selected memory cell or page of memory cells is maintained at a low but positive voltage level while the wordlines of unselected memory cells are brought to a sufficiently high voltage to cause the unselected memory cells to conduct irrespective of any charge that may be on the floating gates of the individual memory cells. If a cell in the selected memory page has an uncharged floating memory gate, it will activate as a result of the low positive voltage level on the wordline, but if the floating gate has a negative charge it will raise the threshold voltage of the memory cell above the low positive voltage applied to the control gate such that the cell does not conduct. The state of each memory cell's floating gate in the page can therefore be determined by monitoring conductivity or current flow between the bit line and source line.

But, the process of specifying a page, reading it, and loading it into the cache 204 to be read by external devices can take a significant amount of time, such as 50 nanoseconds using current technologies. The present invention in one embodiment uses multiple planes of memory and multiple read buffers multiplexed to provide faster data access, as is shown and described in FIG. 3.

Here, block 0 as shown at 301 and block 1 as shown at 302 are each coupled to a primary data cache, such that block 0 at 301 is coupled to a first primary data cache 303 and block 1 shown at 302 is coupled to a second primary data cache 305. The primary data caches are in turn each coupled to a secondary data cache, such that the first primary data cache 303 is coupled to a first secondary data cache 304, and the second primary data cache 305 is coupled to a second secondary data cache 306.

The primary data caches are operable to store or latch data read from their respective connected banks of flash memory, while the secondary data caches are operable to store or cache data provided from the respective coupled primary caches. The secondary caches are both connected to I/O multiplexer 307, which is operable in this example to alternate between providing output data from the first secondary data cache 304 and the second secondary data cache 306. The control logic 308 is operable to control reading of data from the blocks of memory 301 and 302, to control storing this read flash memory page data in the primary data caches 303 and 305, to transfer the data from the primary caches to the secondary caches, and to selectively output the data to output 309 from the secondary data caches via the multiplexer 307.

Figure 3:
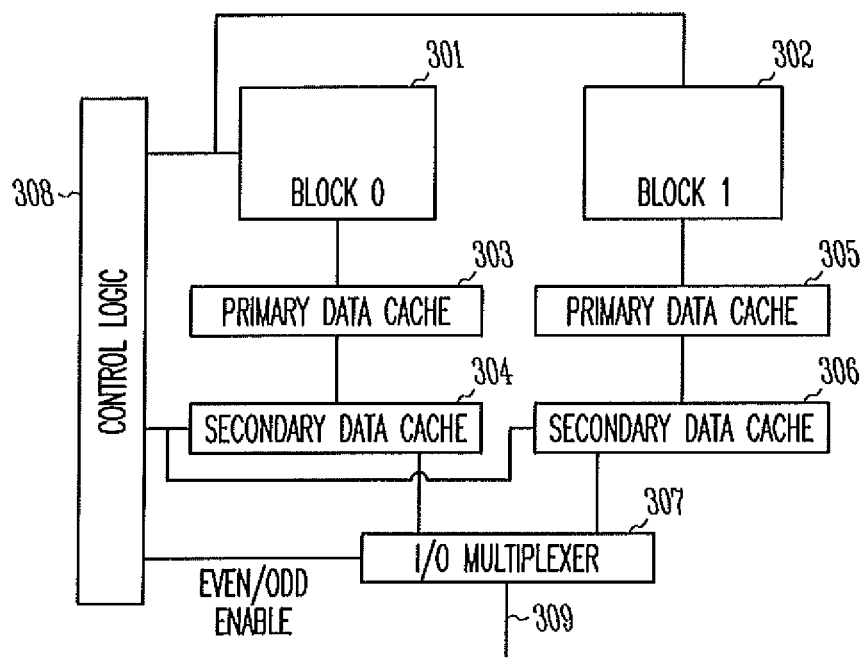
FIG. 3 is a block diagram of a flash memory comprising multiple blocks of multiplexed flash memory, consistent with an example embodiment of the invention.

In one example of operation, each block of flash memory normally takes approximately 20 microseconds to read and latch the output of a block of memory, so that it can be transferred to a bus, a processor, or another electronic system component. Here, block 0 and block 1 shown at 301 and 302 of FIG. 3 are read simultaneously, saving approximately 20 microseconds, and the data read from block 0 is stored in the primary data cache 303 while the data read from block 1 is stored in the primary data cache 305. The data is transferred as a 4 kilobyte page, and is available for transfer from the primary data cache once the first line has been transferred. Once this data is latched in the primary data caches, it is transferred to the secondary data caches, such that the data from the primary data cache 303 is stored in secondary data cache 304, and the data from primary data cache 305 is stored in the secondary data cache 306. The data is then selected for output via multiplexer 307, so that the data in secondary data cache 304 and the data in secondary data cache 306 is alternately made available on output 309.

In various NAND flash embodiments, the amount of data moved into the primary caches is relatively large, such that many words of data are stored in the primary data caches while only those words or bytes presently being transferred out of the memory are sequentially transferred to the secondary data caches. Once the data from the primary data caches has been sequentially latched in the coupled secondary data caches, new data can be read from the memory blocks coupled to the primary data caches and stored in the primary data caches. This is particularly useful during sequential read operations, in which multiple sequentially addressed pages of memory are read in a row.

The previously read data can be transferred from the secondary caches to the output, alternating between secondary data cache 304 and secondary data cache 306 every 25 ns, while new data is being loaded from the primary data caches 303 and 305 into the secondary data caches. The 4 kilobyte page data loaded into the primary data caches takes approximately 20 microseconds to load, which is significantly longer than the time it takes to transfer data from the primary to secondary data caches and multiplex the byte-by-byte data stored in both secondary data caches to the output 309. Single byte data is therefore transferred from the primary data caches to the secondary data caches and multiplexed for output at a much faster rate than 4 kilobyte page reads are completed from memory, but the large page size cached in the primary data caches provides enough data to hide the page read time during a sequential memory operation. Once data from the secondary data caches has been selectively provided to the output via the multiplexer 307, newly read data from the primary caches is transferred to the secondary caches until new data needs to be read into the primary data caches to provide a continuous stream of output data via the multiplexed secondary data caches.

In this way, two blocks of memory 301 and 302, each having a 20 microsecond read latency, can alternately provide pages of memory via a series of data caches and a multiplexer at a rate that is significantly faster than what is possible by reading a single block at a time. In the example presented above, this can be achieved by simultaneously reading pages from both blocks of memory into the primary data caches, and by staggering transfers of data between the primary data caches and secondary data caches by 25 ns. In this case, fresh data is provided to each of the secondary data caches at a rate of one byte every 50 ns, and the data is multiplexed to the output resulting in an effective memory read rate of 25 ns.

In this example, the effective rate of 25 ns is achieved as a throughput rate only, and it still takes over 20 microseconds for the first read data to appear and be latched in the primary data cache. This does not appear as read latency, though, as the busy logic of the memory indicates a busy state until the first data is transferred into the first primary data cache, resulting in an observed latency of approximately 25 nanoseconds. The read throughput for streaming or sequential memory read operations is also significantly improved, from 50 ns to 25 ns. Because typical flash memory reads involve long groups of sequential data, such as music, video, image, or other such data, the improvement in throughput results in significant improvements in perceived performance.

In further examples, the number of blocks read simultaneously and multiplexed to provide output is greater than two. Consider the above example, but with four separate blocks of memory, each block having associated primary and secondary data caches coupled to the multiplexer. Assuming the same 50 ns delay for latching a byte read, a multiplexed output rate of 12.5 ns can be achieved. In another example embodiment, sequential writes to memory are sped up by reversing the process described here, such as by receiving data to be written via input 309 at a rate twice the write latency of a memory block, and multiplexing the data to be written via multiplexer 307 to the secondary and primary data caches associated with each block. Because sequential write speed is also a significant performance criterion for flash memory, the multiplexer of the example of FIG. 3 is shown as an I/O multiplexer, supporting multiplexing both reads and writes.

In other typical NAND flash memory embodiments, data is stored and retrieved in relatively large blocks of memory, such as 128 kilobyte blocks, into the primary data caches. This data is then sequentially provided as output via the secondary data caches and multiplexer, until the last needed data bytes are transferred from the primary caches to the secondary caches. New data is then loaded into the primary data caches while the last data is output from the secondary data caches via the multiplexer, reducing the delay otherwise experienced in loading a new flash block. Although NAND flash memory is therefore best suited for sequential data applications, NAND flash memory cells are approximately 60 percent smaller than NOR flash cells, making them more space efficient than NOR flash with similar capacity.

In a more detailed NAND flash memory example, normal read operation methods include reading a page of NAND flash, such as two kilobyte or four kilobyte page, from flash memory in a flash memory array such as 301. This read NAND flash page is transferred to a coupled primary data cache 303, taking approximately 20 microseconds. Then, one byte or one word of data is transferred from the primary data cache 303 through the secondary data cache and to the I/O connections 309 in approximately 25 nanoseconds.

In a modified sequential read operation, two pages of data, such as the 2 kilobyte or 4 kilobyte NAND flash memory pages in the example above, are loaded from NAND flash memory arrays 301 and 302 into primary data caches 303 and 305, taking approximately 20 microseconds. Selected words or bytes from the cached pages are then loaded into the secondary cache 304 and 306 in approximately 25 nanoseconds, where the word or byte data is sequentially multiplexed to the input/output connection 309 via the multiplexer 307. Although the first word will take approximately 25 nanoseconds to appear at the output, the following multiplexed words will be output with approximately 12.5 nanoseconds between words, due to multiplexing the output of two data streams via multiplexer 307. In further examples, more data streams such as four or eight memory paths are multiplexed, increasing the data throughput rate to four or eight times the data rate of a single memory channel. The word output rate of 12.5 nanoseconds or faster per word is therefore significantly faster than the normal read operation output rate, or the data output rate of traditional NAND memory systems.

Figure 4:
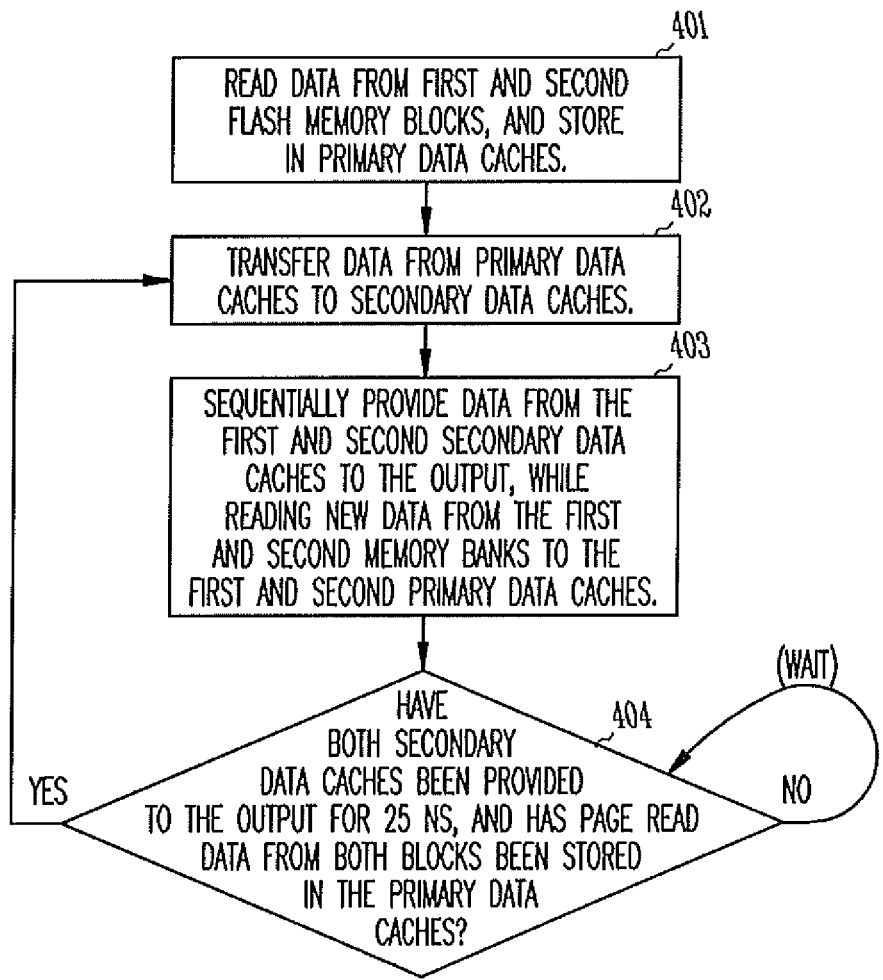
FIG. 4 is a flowchart, illustrating a method of practicing one example embodiment of the invention.

FIG. 4 is a flowchart, illustrating an example method of operating a flash memory such as that of FIG. 3. At 401, the first data in a sequential data read is read from the flash memory blocks 0 and 1, and is stored in the primary data caches 303 and 305. The data reads are performed at the same time, and the data is stored in the primary data caches at approximately the same time. Once the data has been stored in the primary data caches, it is transferred to the secondary data caches at 402, such that the data from block 0 stored in primary data cache 303 is transferred to secondary data cache 304, and the data stored in primary data cache 305 from memory block 1 is stored in secondary data cache 306. The data in the secondary data caches is then sequentially provided to the output 309 via multiplexer 307 at 403 of the flowchart, while a new data read is initiated in both blocks and the read data is stored in primary data caches 303 and 305.

In this example, reading the memory and storing it in the primary data caches takes approximately 20 microseconds, and the multiplexed data is output at a rate of 25 ns, so that the read completes and is latched in the primary data caches at about the same time as the data stored in each of the secondary data caches has been output via the multiplexer for approximately 25 ns each. Once the newly read data is read and latched, and the data from the secondary caches has been output via the multiplexer for the desired 25 ns as shown at 404, the process returns to step 402, and the newly read data is transferred from the primary data caches to the secondary data caches. This data is then output via the multiplexer at 403 while the next group of sequential pages is read, and such a pattern continues until there are no more pages in the sequential data read to be read and output from the flash memory system.

The examples presented here have shown how reads or writes to two or more flash memory banks can be performed using a multiplexer, along with a series of read buffers or caches, to provide greater flash memory throughput for streaming or sequential flash memory operations than can be achieved using traditional memory access methods. This is of particular benefit when working with data files such as streaming video, audio, or images that comprise large amounts of sequential data, such as are commonly used in digital cameras, digital music players, cellular telephones, and other such electronic devices.

Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An electronic device comprising:
   first and second blocks of flash memory;
   a first primary data cache coupled to the first block of flash memory and a second primary data cache coupled to the second block of flash memory;
   a first secondary data cache coupled to the first primary data cache, and
   a second secondary data cache coupled to the second primary data cache;
   a multiplexer operable to selectively output data from the first and second secondary data caches; and
   control logic operable to control transfer of data from the flash memory blocks to the primary data caches, to control transfer of data from the primary data caches to the secondary data caches, and to control operation of the multiplexer to selectively output data from the first and second secondary data caches such that loading data from the first and second pages into the first and second primary data caches occurs while previously loaded data is sequentially provided from the first and second secondary data caches via the multiplexer;
   wherein the electronic device is capable of performing flash memory operations selected from the group consisting of streaming operations and sequential operations.

2. The electronic device of claim 1, wherein the device is selected from the group consisting of a digital music player, a cellular telephone, a personal digital assistant, or a digital camera.

3. The electronic device of claim 1, wherein the control logic is further operable to control the multiplexer to alternately output data from the first secondary data cache and second secondary data cache.

4. The electronic device of claim 3, wherein the control logic further operable to read data from the first block of flash memory and store it in the first primary data cache and to read data from the second block of flash memory and store it in the second primary data cache while the multiplexer alternately outputs data from the first secondary data cache and second secondary data cache.

5. The electronic device of claim 4, wherein the flash memory controller is further operable to load data from the first primary data cache into the first secondary data cache and to load data from the second primary data cache into the second secondary data cache after data is loaded into the first and second primary data caches.

6. The electronic device of claim 1, wherein the control logic is further operable to perform a sequential read operation of three or more sequential flash memory pages.

7. The electronic device of claim 1, the multiplexer further operable to output data at a rate at least twice the read latency rate of a flash memory block.

8. The electronic device of claim 1, wherein the data read from the first block of flash memory and the second block of flash memory comprise sequential flash memory pages.

* * * * *